United States Patent [19]

Muto

[11] 3,971,684
[45] July 27, 1976

[54] ETCHING THIN FILM CIRCUITS AND SEMICONDUCTOR CHIPS

[75] Inventor: Steve Yoneo Muto, Cupertino, Calif.

[73] Assignee: Hewlett-Packard Company, Palo Alto, Calif.

[22] Filed: Apr. 14, 1975

[21] Appl. No.: 568,534

Related U.S. Application Data

[63] Continuation of Ser. No. 420,990, Dec. 3, 1973, abandoned.

[52] U.S. Cl. .................................. 156/13; 156/17; 252/79.1
[51] Int. Cl.² ....................................... C09K 13/00
[58] Field of Search ...................... 156/7, 8, 17, 13; 204/182, 129.1; 252/79.1

[56] References Cited
UNITED STATES PATENTS

| | | | |
|---|---|---|---|
| 3,546,036 | 12/1970 | Manaseuit | 156/17 |
| 3,661,747 | 5/1972 | Byrnes, Jr. et al. | 204/192 |
| 3,664,942 | 5/1972 | Havas et al. | 204/192 |
| 3,795,557 | 3/1974 | Jacob | 156/17 |
| 3,816,198 | 6/1974 | La Combe et al. | 156/17 |
| 3,880,684 | 4/1975 | Abe | 156/17 |
| 3,935,328 | 1/1976 | Sugano et al. | 156/17 |

Primary Examiner—Douglas J. Drummond
Assistant Examiner—Jerome W. Massie
Attorney, Agent, or Firm—Ronald E. Grubman

[57] ABSTRACT

A method is provided for etching thin film circuits or semiconductor chips to produce well defined vertically etched walls at rapid etching rates. The substrates to be etched are covered by masks and positioned on a cathode electrode enclosed in a container. Also enclosed in the container is a chemically-reactive gas used as an etchant. According to the method the cathode is negative-biased to ionize the reactive gas and attract the chemically reactive ions toward the cathode. These reactive ions impinge on the substrates in a predominantly vertical direction to produce well defined vertically etched walls.

6 Claims, 1 Drawing Figure

ETCHING THIN FILM CIRCUITS AND SEMICONDUCTOR CHIPS

This is a continuation of application Ser. No. 420,990, filed Dec. 3, 1973, now abandoned.

BACKGROUND OF THE INVENTION

An important step in the manufacture of semiconductor chips and thin film circuitry is the etching of the different layers which make up the finished semiconductor chip or thin film circuit.

In the manufacture of thin film circuits, one method of etching has been to overlay the surface to be etched with a suitable mask and immerse the circuit and mask in a chemical solution which attacks the surface to be etched while leaving the mask intact. It has been difficult with the chemical etching processes presently known to achieve well-defined edges on the etched surfaces. The difficulty arises because the chemicals used for etching tend to undercut the mask, i.e. the wet chemical seeps under the mask and continues to attack the surface to be etched even under the masked area. A related difficulty which is encountered with certain materials is that the chemical etchant tends to eat through the surface to be etched and attack the substrate beneath. It is therefore very difficult to use wet chemical etching to achieve fine structures.

Etching of thin film circuits has also been done by a process sometimes called sputter etching. Typically a container such as a bell-jar is filled with an inert gas such as argon. In the container are placed an anode and a cathode, the latter of which is negative-biased relative to the former, e.g. by means of an applied RF signal. A surface to be etched is covered by a suitable mask of a material such as photoresist and is then placed on the cathode. When a negative bias is applied to the cathode, the inert gas in the region between the cathode and the anode is ionized and the positive ions are attracted toward the cathode. Those ions which strike the surface to be etched serve to knock atoms off the surface, thereby gradually etching through the material. In this process the photoresist mask is also etched but at a slower rate than the surface desired to be etched. Although this sputter etching process produces better defined edges than the chemical etching process, it is typically very slow, especially on TaN surfaces which are important in thin film work.

In the manufacture of semiconductor chips, another procedure (sometimes called plasma etching) is used, in which a container such as a bell-jar is filled with a gas such as $CF_4$ whose constituent ions are chemically reactive. A surface to be etched is covered by a mask and inserted into the container along with the reactive gas. To etch the surface, an RF exciting coil around the container is activated to excite the $CF_4$, thereby dissociating the $CF_4$ and forming various positive and negative ions. The dissociated ions apparently then chemically interact with the surface to be etched producing various gases as a reaction product. As with the wet chemical etching process described above this type of plasma etching also results in undercutting of the mask areas so that it is difficult to achieve well-defined edges.

SUMMARY OF THE INVENTION

In accordance with the illustrated preferred embodiment, the present invention provides a method of etching either thin film circuits or semiconductor chips which is capable of producing extremely well-defined edges on etched materials, while at the same time achieving rapid etching rates. According to the method a gas or gas mixture whose constituent ions are chemically reactive is placed in a container along with a cathode electrode and an anode electrode. A surface to be etched is covered by a suitable mask and mounted on one of the electrodes, e.g. the cathode which is negative-biased relative to the remaining electrode, e.g. by applying an RF biasing signal. An electric field is thus established in the region between the cathode and the anode, and serves to dissociate the reactive gas. Chemically reactive gas ions are attracted to the cathode and thereby impinge on the sample to be etched. Apparently, the surface is etched both by chemical interaction with the active ions and by the momentum transfer of the ions impinging on the surface. By virtue of the electric field attracting ions to the cathode, the ions impinge on the surface to be etched predominantly in a direction perpendicular to that surface, so that the process produces well-defined vertically etched side walls.

DESCRIPTION OF THE INVENTION

Figure 1:
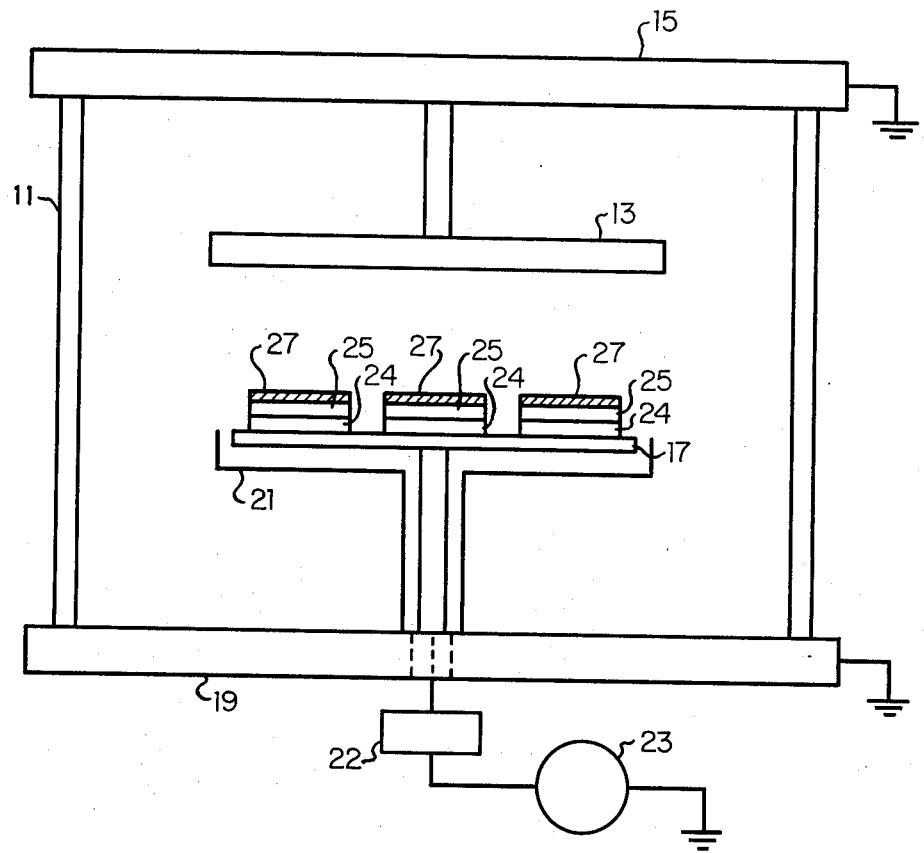
FIG. 1 illustrates the etching of several surfaces in accordance with the present method.

In FIG. 1 there is illustrated a containment vessel 11 which is preferably a glass bell-jar but which may also be e.g. a metal bell-jar or other suitable container. Within vessel 11 there is an anode electrode plate 13. Anode plate 13 is illustrated as being electrically and mechanically connected with a metal top plate 15 of vessel 11, the plate 15 being itself electrically connected to an electrical ground. Also enclosed within vessel 11 is a cathode electrode plate 17 supported on a base plate 19 of vessel 11. An electrical ground shield 21 surrounds cathode 17. Ground shield 21 is electrically connected with base plate 19, which is itself electrically grounded. An RF power supply 23, which may be any of a number of standard RF power supplies known in the art is connected with cathode 17 through a standard RF matching network 22. RF supply 23 is used to effectively negative-bias cathode 17 with respect to anode 13. A DC negative bias may alternatively be applied between cathode 17 and anode 13 in place of RF supply 23 and matching network 22, but RF biasing is preferred. Several substrates 24 including surfaces to be etched 25 are placed on cathode plate 17. Typical materials which can be etched according to the invention are tantalum nitride, molybdenum, and tungsten, often used in connection with thin film circuits. Materials such as silicon, silicon dioxide, and silicon nitride, often used in the production of semiconductor chips are also suitable candidates for etching according to the present method. Surfaces 25 are overlayed with suitable etching masks 27 of a material such as aluminum, gold, or photoresist. Particularly for etching patterns in silicon or silicon dioxide an aluminum film of about $0.1\mu$ thickness has been found to provide a suitable mask. If surface 25 is of silicon, a thin layer of silicon dioxide can be used between the silicon surface 25 and aluminum mask 27 to prevent alloying between the silicon and the aluminum.

Although etching of surfaces 25 on substrates 24 has been described, it is apparent that by masking substrates 24 directly, the method may also be used to etch substrates 24, if such etching of the substrates is desired.

In accordance with the method, a gas or gas mixture having at least some constituent ions which are chemically reactive is introduced into vessel 11. Gases of this type will be referred to in the present specification and claims as "chemically active gases", of which a representative gas is $CF_4$. Other chemically reactive gases such as $SF_6$ or $CCl_2F_2$ may also be used, but $CF_4$ is preferred and gives excellent results. It should be noted that if vessel 11 is a completely metallized bell-jar rather than a glass bell-jar then some oxygen should be introduced into the vessel to prevent the accumulation of carbon deposits resulting from chemical interactions with the $CF_4$.

In operation according to the method, the chemically reactive gas is maintained at a pressure of between $5\mu$ and $100\mu$. Rf power supply 23 is turned on to effectively negative bias cathode 17 with respect to anode 13. An electric field is thereby established in the region between cathode 17 and anode 13, which serves to ionize the $CF_4$ in that region. Positive ions from the reactive gas are attracted to negative-biased cathode 17 and will impinge on cathode 17 in a vertical direction. Some of the ions so attracted will impinge on substrates 25 and chemically interact to etch away areas not covered by masks 27. Evidently, etching action proceeds both by chemical interaction of the reactive ions with the surfaces and by a momentum transfer of the ions impinging on the surface. This method of etching thus tends to produce very rapid etch rates and well-defined vertically etched walls. For example, it has been found that silicon substrates which are etched by sputter etching processes known in the art at a rate of about 150 A per minute can be etched with the present method at rates of about 400 to 500 A per minute. Similarly, etching to a TaN surface which is accomplished through sputter etching at a rate of about 70 A per minute may be etched at about 200 A per minute with the present method. Well-defined vertical walls were obtained in both cases.

I claim:

1. A method of etchng a surface comprising the steps of:

positioning the surface to be etched on a first electrode plate;

masking the surface to be etched with an etching mask;

enclosing in a container the first electrode plate, the surface to be etched and etching mask, and a second electrode plate positioned opposite the first electrode plate;

introducing a chemically reactive etchant gas into the container; and electrically biasing the first electrode plate relative to the second electrode plate to ionize the chemically reactive etchant gas in the region between the two plates and to accelerate chemically reactive etchant gas ions toward the first electrode in a direction substanially perpendicular to the surface to be etched, whereby the surface is directionally etched by chemically reactive ions from the chemically reactive gas.

2. A method as in claim 1 wherein the chemically reactive etchant gas is selected from the group consisting of $CF_4$, $SF_6$, and $CCl_2F_2$.

3. A method as in claim 2 wherein the step of masking the surface to be etched comprises masking the surface with an aluminum mask.

4. A method as in claim 2 wherein the container is entirely of metal and including the step of enclosing oxygen in the container.

5. A method as in claim 1 wherein the chemically reactive etchant gas is a fluoride containing gas.

6. A method as in claim 1 wherein the chemically reactive gas is a chloride containing gas.

* * * * *